United States Patent
Chung et al.

(10) Patent No.: US 8,546,201 B2
(45) Date of Patent: Oct. 1, 2013

(54) METHOD OF CRYSTALLIZING SILICON LAYER AND METHOD OF FORMING A THIN FILM TRANSISTOR USING THE SAME

(75) Inventors: Yun-Mo Chung, Yongin (KR); Ki-Yong Lee, Yongin (KR); Jin-Wook Seo, Yongin (KR); Min-Jae Jeong, Yongin (KR); Yong-Duck Son, Yongin (KR); Byung-Soo So, Yongin (KR); Seung-Kyu Park, Yongin (KR); Byoung-Keon Park, Yongin (KR); Dong-Hyun Lee, Yongin (KR); Kil-Won Lee, Yongin (KR); Tak-Young Lee, Yongin (KR); Jong-Ryuk Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 125 days.

(21) Appl. No.: 13/067,384

(22) Filed: May 27, 2011

(65) Prior Publication Data
US 2011/0300674 A1 Dec. 8, 2011

(30) Foreign Application Priority Data
Jun. 3, 2010 (KR) .................. 10-2010-0052353

(51) Int. Cl.
*H01L 21/30* (2006.01)
*H01L 21/336* (2006.01)

(52) U.S. Cl.
USPC ............................. 438/151; 438/584; 438/771

(58) Field of Classification Search
USPC ............................................. 438/771
See application file for complete search history.

(56) References Cited

U.S. PATENT DOCUMENTS

| 5,030,536 A * | 7/1991 | Pai et al. ............... 430/127 |
| 2001/0023092 A1 | 9/2001 | Ohtani et al. |
| 2002/0084261 A1 * | 7/2002 | Yamazaki ............ 219/390 |
| 2006/0160357 A1 * | 7/2006 | Muranaka ............ 438/642 |
| 2007/0054499 A1 * | 3/2007 | Jang et al. ............ 438/778 |

FOREIGN PATENT DOCUMENTS

| KR | 10-0297318 B1 | 11/2001 |
| KR | 10-2003-0060403 A | 7/2003 |
| KR | 10-2005-0113414 A | 12/2005 |
| KR | 10-2007-0097329 A | 10/2007 |
| KR | 10-2008-0036502 A | 4/2008 |
| KR | 10-2008-0052769 A | 6/2008 |
| KR | 10-2009-0083186 A | 8/2009 |

OTHER PUBLICATIONS

Korean Office Action in KR 10-2010-0052353, dated Sep. 9, 2011 (Chung, et al.).

* cited by examiner

*Primary Examiner* — Angel Roman
(74) *Attorney, Agent, or Firm* — Lee & Morse, P.C.

(57) ABSTRACT

A method of crystallizing a silicon layer and a method of manufacturing a thin film transistor using the same, the method of crystallizing the silicon layer including forming an amorphous silicon layer on a substrate; performing a hydrophobicity treatment on a surface of the amorphous silicon layer so as to obtain a hydrophobic surface thereon; forming a metallic catalyst on the amorphous silicon layer that has been subjected to the hydrophobicity treatment; and heat-treating the amorphous silicon layer including the metallic catalyst thereon to crystallize the amorphous silicon layer into a polycrystalline silicon layer.

17 Claims, 9 Drawing Sheets

METHOD OF CRYSTALLIZING SILICON LAYER AND METHOD OF FORMING A THIN FILM TRANSISTOR USING THE SAME

BACKGROUND

1. Field

Embodiments relate to a method of crystallizing a silicon layer and a method of forming a thin film transistor using the same.

2. Description of the Related Art

Thin film transistors (TFTs) are a particular kind of field effect transistors that are formed by forming a semiconductor thin film on an insulating support substrate. Like a field effect transistor, a TFT includes a gate, a drain, and a source, and the major function of the TFT is a switching operation. TFTs may be used in sensors, memory devices, and optical devices and may be used as a pixel switching device or as an operating device of a flat panel display.

In general, commercially available products, e.g., notebook PCs, monitors, TVs, or mobile devices, may include an amorphous-silicon TFT (a-Si TFT). Amorphous-silicon refers to a certain type of silicon of which an atomic arrangement is, irregular, and has a short range order and does not have a long range order, unlike that of a crystal. Amorphous-silicon may be easily deposited over a large area and may be easily formed on a glass substrate at low temperatures. Due to these features, amorphous-silicon may be the most frequently used material in TFTs. However, since demand for large high-quality displays is increasing, high-performance devices are desired. Thus, high-performance TFTs having a higher electron mobility rate than that possible with an a-Si TFT, which has an electron mobility rate of about 0.5 to about 1 $cm^2/Vs$, and a method of manufacturing the high-performance TFTs are also desired.

A polycrystalline silicon TFT (poly-Si TFT) may exhibit a substantially high performance compared to a conventional a-Si TFT. An electron mobility rate of a polycrystalline silicon TFT may be in the range of a few to several hundred $cm^2/Vs$. Due to these features, a poly-Si TFT may allow, e.g., a data operating circuit or peripheral circuit requiring a high electron mobility rate to be mounted on a substrate, and may also allow formation of a small channel of a TFT so as to increase an aperture ratio of a screen. In addition, since there may be no limitation on an interconnection pitch for connection to an operating circuit along with an increasing pixel number, due to the installation of the operating circuit, high-resolution may be obtained. Also, operating voltage and electric power consumption may be reduced, and device characteristics may be far less degraded.

Methods of forming polycrystalline silicon may be categorized into a low temperature process and a high temperature process, according to a process temperature. In a high temperature process, an expensive quartz substrate with a high thermal resistance may be used instead of a glass substrate because the process temperature may be equal to or higher than a temperature at which an insulating substrate is deformed. In addition, a polycrystalline silicon layer formed by using the high-temperature process may have low-quality crystallinity, e.g., high surface roughness or micro grains.

In a low temperature process, amorphous silicon that is deposited at a low temperature may be crystallized into a polycrystalline silicon. As a low-temperature crystallization technique, an eximer laser crystallization (ELC) technique and a crystallization technique using a metal as a catalyst have been researched. In the ELC technique, melting and solidification of amorphous silicon may be repeatedly performed by irradiating a pulse-type laser beam onto a substrate in a unit of a nano second. The laser crystallization technique, however, may be expensive, time-consuming, and inefficient.

When amorphous silicon is crystallized into polycrystalline silicon by using a crystallization technique using a metallic catalyst, micro-control of the metallic catalyst may be important. A metallic catalyst may be deposited or coated on an amorphous silicon layer by, e.g., a sputtering method such as physical vapor deposition (PVD), chemical vapor deposition (CVD) such as atomic layer deposition (ALD), or ion implantation.

SUMMARY

Embodiments are directed to a method of crystallizing a silicon layer and a method of forming a thin film transistor using the same, which represents advances over the related art.

It is a feature of an embodiment to provide a method of crystallizing a silicon layer in which a metallic catalyst is stably formed in a small amount and thus leakage current characteristics are improved.

At least one of the above and other features and advantages may be realized by providing a method of crystallizing a silicon layer, the method including forming an amorphous silicon layer on a substrate; performing a hydrophobicity treatment on a surface of the amorphous silicon layer so as to obtain a hydrophobic surface thereon; forming a metallic catalyst on the amorphous silicon layer that has been subjected to the hydrophobicity treatment; and heat-treating the amorphous silicon layer including the metallic catalyst thereon to crystallize the amorphous silicon layer into a polycrystalline silicon layer.

Performing the hydrophobicity treatment may include using a solution of a hydrogen or fluorine-containing material.

The solution of the hydrogen or fluorine-containing material may include HF.

Performing the hydrophobicity treatment may further include controlling a degree of hydrophobicity after treating with the solution of the hydrogen or fluorine-containing material.

Controlling the degree of hydrophobicity may include treating the amorphous silicon layer with deionized water.

Performing the hydrophobicity treatment may include performing an ultra pure water treatment, performing a diluted hydrogen fluoride (DHF) solution treatment, performing an ultra pure water treatment, performing an ultra pure water treatment, and drying, which are performed in the stated order.

Performing the hydrophobicity treatment may include treating the amorphous silicon layer with hydrogen plasma or fluorine plasma.

The fluorine plasma may include $CF_4$ gas, $CHF_3$ gas, $C_2F_6$ gas, $C_3F_8$ gas, $F_2$ gas, or $NF_3$ gas.

Performing the hydrophobicity treatment may further include controlling a degree of hydrophobicity after treating with hydrogen plasma or fluorine plasma.

Forming the metallic catalyst may include forming a metallic catalyst by physical vapor deposition (PVD), atomic layer deposition (ALD), or ion implantation.

The metallic catalyst may be formed by ALD and a process temperature of the ALD may be about 160 to about 240° C.

Forming the metallic catalyst may include forming the metallic catalyst having a density of about $10^{11}$ to $10^{14}$ atom/$cm^2$.

At least one of the above and other features and advantages may also be realized by providing a method of manufacturing a thin film transistor (TFT), the method including forming a polycrystalline silicon layer on a substrate by using the method of an embodiment; forming a gate insulating layer on the polycrystalline silicon layer; forming a gate electrode on the gate insulating layer; forming source/drain regions in opposite ends of the gate electrode; forming an interlayer insulating layer on the gate electrode and the gate insulating layer; and forming a source/drain electrode such that the source/drain electrode passes through the interlayer insulating layer and contacts any one of the source/drain regions.

Performing the hydrophobicity treatment may include using a solution of a hydrogen or fluorine-containing material.

Performing the hydrophobicity treatment may include treating the amorphous silicon layer with hydrogen plasma or fluorine plasma.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
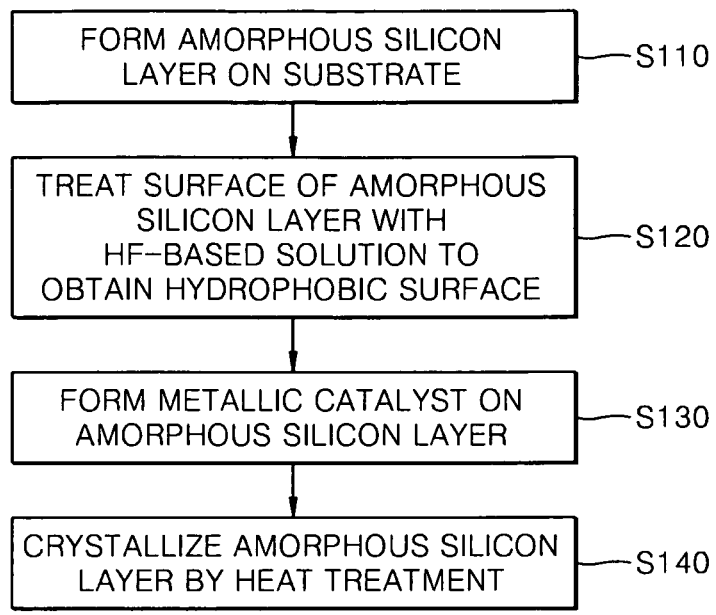
FIG. 1 illustrates a flowchart for explaining a method of crystallizing a silicon layer according to an embodiment.

Korean Patent Application No. 10-2010-0052353, filed on Jun. 3, 2010, in the Korean Intellectual Property Office, and entitled: "Method of Crystallizing Silicon Layer and Method of Forming Thin Film Transistor By Using the Method," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a flowchart for explaining a method of crystallizing a silicon layer according to an embodiment. Referring to FIG. 1, an amorphous silicon layer may be formed on a substrate (S110). The substrate may include, e.g., glass, quartz, or a plastic material. In an implementation, silicon, ceramic, and/or metal may also be used to form the substrate. In order to obtain a flat substrate and prevent diffusion of impurities from the substrate, or when the substrate includes a movable ion or has conductivity, a buffer layer for providing insulation may be provided. The buffer layer may include, e.g., silicon oxide, silicon nitride, and/or silicon oxynitride. The amorphous silicon layer may be formed by, e.g., plasma enhanced chemical vapor deposition (PECVD), but the formation method is not limited thereto.

Then, the amorphous silicon layer may be treated with a solution of a hydrogen or fluorine containing material, e.g., HF-based solution, to provide hydrophobicity to a surface of the amorphous silicon layer (S120). A thermal oxide layer may be formed on the surface of the as-deposited amorphous silicon layer during the deposition process or a natural oxide layer may be formed on the surface of the as formed amorphous silicon layer when exposed to air; and the thermal oxide layer and the natural oxide layer may have hydrophilic surfaces. By treating the amorphous silicon layer with the, e.g., HF-based solution, the thermal oxide layer and the natural oxide layer may be removed; and the surface of the amorphous silicon layer may be passivated with, e.g., —H or —F. Thus, the surface of the amorphous silicon layer may have hydrophobic properties. The treatment with the, e.g., HF-based solution, may be performed by any suitable method including, e.g., dipping the substrate in the solution or spin-washing.

An additional process may be further performed to control a degree of the hydrophobicity. In order to obtain a desired amount of the metallic catalyst thereon, the amorphous silicon layer having the hydrophobic surface may be treated with deionized water to lessen the degree of hydrophobicity.

Then, a metallic catalyst may be formed on the amorphous silicon layer having the hydrophobic surface (S130). The metallic catalyst may include a metal, e.g., nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and/or plutonium (Pt). The metallic catalyst may be formed by, e.g., sputtering such as physical vapor deposition (PVD), or chemical vapor deposition (CVD) such as atomic layer deposition (ALD). Since the metallic catalyst may not be well adsorbed to the hydrophobic surface of the amorphous silicon layer, the metallic catalyst may be micro-controlled even in a condition for forming a high-density metallic catalyst layer. Accordingly, a very small amount of the metallic catalyst may be reproducibly and stably formed.

Then, the amorphous silicon layer may be crystallized by a heat treatment (S140). The heat treatment may be performed at a temperature of about 600 to about 800° C. Due to the metallic catalyst formed on the amorphous silicon layer, the crystallization may be induced at a low temperature. Due to the formation of the hydrophobic surface of the amorphous silicon layer, the metallic catalyst may be formed at a low density and thus, a crystallization seed may be formed at an appropriate density. The appropriate density of the crystallization seed may facilitate sufficient growth of polycrystalline silicon crystals. In addition, the presence of the small amount of the metallic catalyst in the polycrystalline silicon may result in a substantial improvement in leakage current characteristics.

Figure 2:
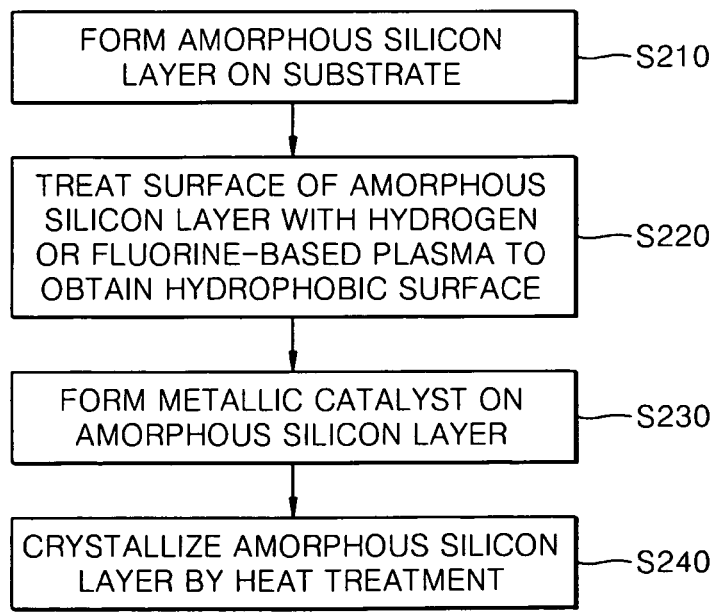
FIG. 2 illustrates a flowchart for explaining a method of crystallizing a silicon layer according to another embodiment.

FIG. 2 illustrates a flowchart for explaining a method of crystallizing a silicon layer according to another embodiment. Referring to FIG. 2, an amorphous silicon layer may be formed on a substrate (S210). As described above, the substrate may be formed of, e.g., glass, quartz, or a plastic material. In an implementation, silicon, ceramic, and metal may also be used to form the substrate. In order to obtain a flat substrate and prevent diffusion of impurities from the substrate, or when the substrate includes a movable ion or has conductivity, a buffer layer for providing insulation may be included. The buffer layer may be formed of, e.g., silicon oxide, silicon nitride, or silicon oxy-nitride. The amorphous silicon layer may be formed by, e.g., PECVD, but the formation method is not limited thereto.

Then, the amorphous silicon layer may be treated with, e.g., hydrogen plasma or fluorine plasma, so that a surface of the amorphous silicon layer has hydrophobicity (S220). The fluorine plasma may be a fluorine (F)-containing gas, e.g., $CF_4$, $CHF_3$, $C_2F_6$, $C_3F_8$, $F_2$, or $NF_3$, but the plasma type is not limited thereto.

A thermal oxide layer or a natural oxide layer that may be formed on the surface of the formed amorphous silicon layer may be removed by the plasma treatment. The surface of the amorphous silicon layer may be passivated with —H or —F and thus the surface of the amorphous silicon layer may have hydrophobicity or hydrophobic properties. Alternatively, even if the thermal oxide layer or natural oxide layer formed on the surface of the formed amorphous silicon layer is not removed, the surface of the amorphous silicon layer may still be passivated by the plasma treatment and thus the surface of the amorphous silicon layer may have the hydrophobicity. Meanwhile, an additional process may be further performed to control a degree of hydrophobicity. In order to be suitably prepared for obtaining or receiving a desired amount of the metallic catalyst, the amorphous silicon layer having the hydrophobic surface may be subjected to a plasma treatment using an oxygen-containing gas, a nitrogen-containing gas, or $H_2O$ gas to lessen the degree of hydrophobicity.

Then, a metallic catalyst may be formed on the amorphous silicon layer having the hydrophobic surface (S230). As described above, the metallic catalyst may be formed of a metal, e.g., nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and/or plutonium (Pt). The metallic catalyst may be formed by, e.g., sputtering such as physical vapor deposition (PVD), or chemical vapor deposition (CVD) such as atomic layer deposition (ALD). Since the metallic catalyst may not be well adsorbed to the hydrophobic surface of the amorphous silicon layer, the metallic catalyst may be micro-controlled even in a condition for forming a high-density metallic catalyst layer. Accordingly, a very small amount of the metallic catalyst may be reproducibly and stably formed.

Then, the amorphous silicon layer may be crystallized by a heat treatment (S240). The heat treatment may be performed at a temperature of about 600 to about 800° C. Due to the metallic catalyst on the amorphous silicon layer, the crystallization may be induced at a low temperature. Due to the formation of the hydrophobic surface of the amorphous silicon layer, the metallic catalyst may be formed at a low density. Thus, a crystallization seed may be formed at an appropriate density. The appropriate density of the crystallization seed may facilitate sufficient growth of polycrystalline silicon crystals. In addition, the presence of the small amount of the metallic catalyst contained in the polycrystalline silicon may result in a substantial improvement in leakage current characteristics.

FIGS. 3A to 3E illustrate conceptual views for explaining a micro-control mechanism for a metallic catalyst according to an embodiment.

Figure 3:
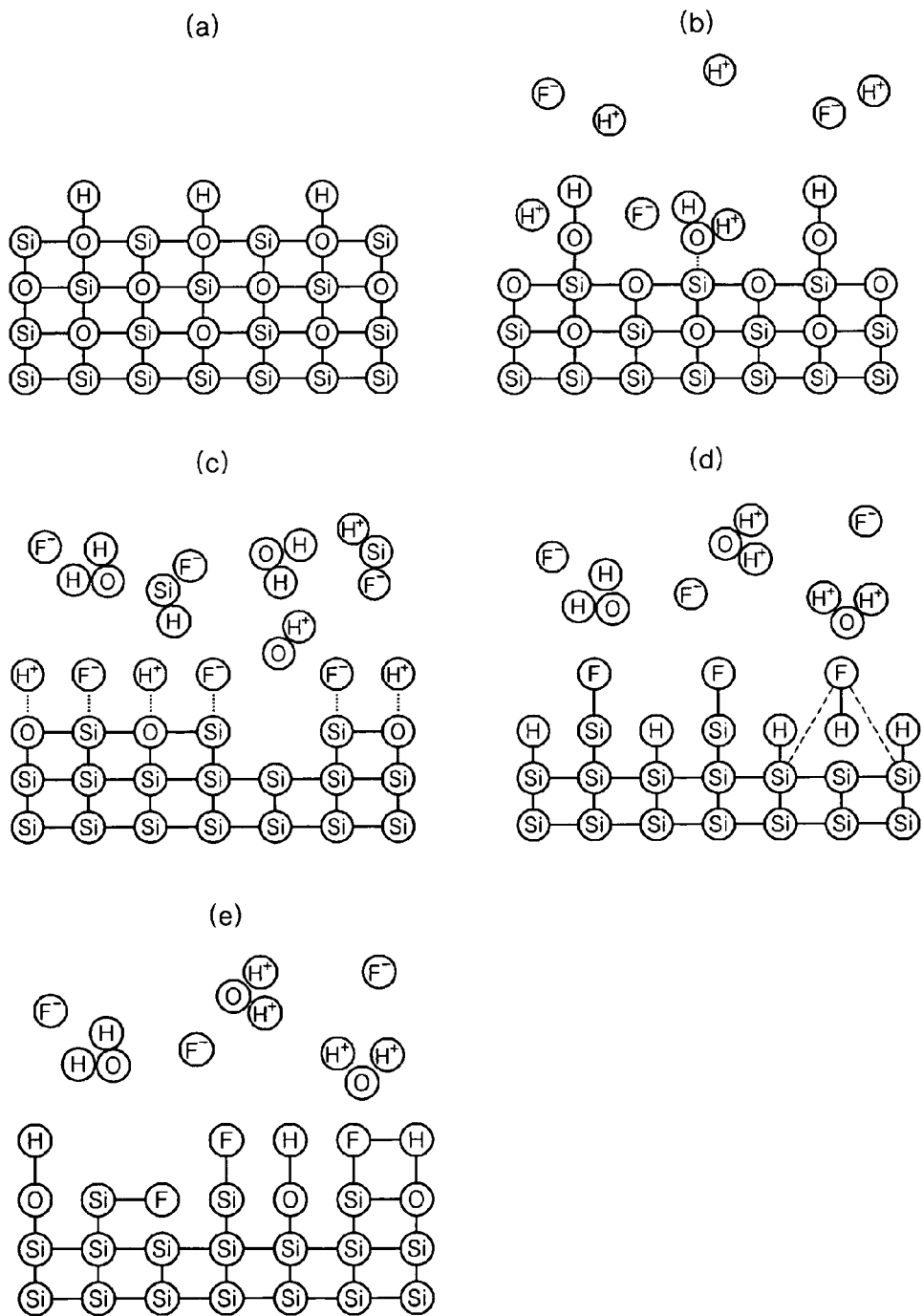
FIGS. 3A through 3E illustrate conceptual views for explaining a micro-control mechanism for a metallic catalyst according to an embodiment.

FIG. 3A illustrates an as-deposited amorphous silicon layer. The as-deposited amorphous silicon layer may be covered by a thermal oxide layer formed during a deposition process and/or a natural oxide layer formed when exposed to air. The thermal oxide layer and the natural oxide layer may have hydrophilic surfaces. A hydrophilic surface may have a high surface energy and thus, adsorption may easily occur to thereby decrease the surface energy. Thus, the metallic catalyst may be easily deposited thereon. On the other hand, a hydrophobic surface may have a low surface energy, which means adsorption may hardly occur. Thus, the metallic catalyst may not be well deposited. Accordingly, the amorphous silicon layer covered by the thermal oxide layer or the natural oxide layer may have a hydrophilic surface and deposition may easily occur.

FIGS. 3B through 3D illustrate a process of forming a hydrophobic surface by treating the as-deposited amorphous silicon layer with an HF solution. Referring to FIG. 3B, $H^+$ ions generated from, e.g., an HF solution, may be attached to —OH on a surface of the amorphous silicon layer to form —$H_2O^+$. Referring to FIG. 3C, $H_2O$ may be separated from the surface of the amorphous silicon layer and F— may be bonded to Si and then separated from the amorphous silicon layer. Although, as illustrated in FIG. 3C, F— may be bonded to Si to form HSiF— and $H^+$SiF, other forms, e.g., $SiF_4$ may also be formed by bonding F— to Si, and these may also be separated from the amorphous silicon layer. Referring to FIG. 3D, the natural oxide layer and the thermal oxide layer on the amorphous silicon layer may be removed and the surface of the amorphous silicon layer may be passivated with —H or —F, so that the amorphous silicon layer may have a hydrophobic surface having a low surface energy.

Referring to FIG. 3E, the amorphous silicon layer may be treated with deionized water to form a thin silicon oxide layer on the surface of the amorphous silicon layer, so that portions of the surface of the amorphous silicon layer may have weak hydrophilicity. By doing so, a hydrophobicity degree of the amorphous silicon layer may be controlled.

Figure 4A:
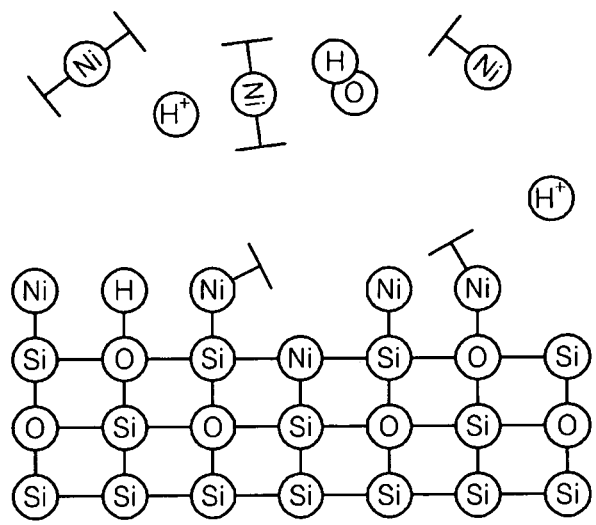
FIGS. 4A through 4C illustrate conceptual views showing varying deposition degrees of a metallic catalyst according to a hydrophobicity degree of a surface of a silicon layer when an amount of a metallic catalyst used is constant.
Figure 4B:
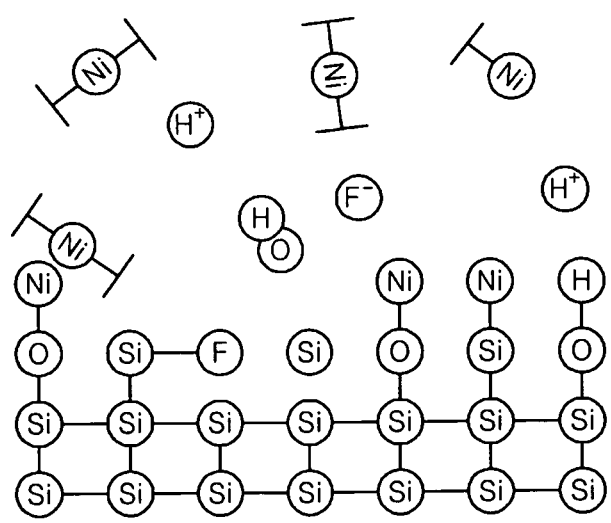
Figure 4C:
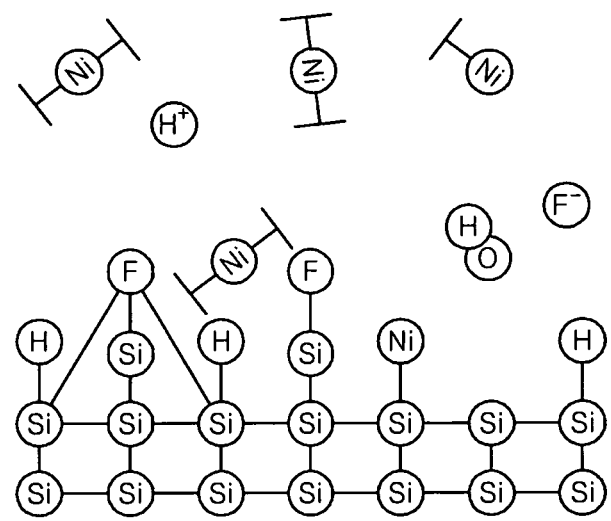

FIGS. 4A through 4C illustrate conceptual views of varying deposition degrees of a metallic catalyst according to a hydrophobic degree of a surface of a silicon layer when an amount of a metallic catalyst used is constant. Referring to FIG. 4A, due to the presence of the natural oxide layer or the thermal oxide layer on the surface of the silicon layer, the surface of the silicon layer may have strong hydrophilicity and thus the metallic catalyst may cover the surface at a high density. Referring to FIG. 4B, due to formation of silicon oxide on a portion of the surface of the silicon layer, the surface of the silicon layer may have weak hydrophilicity and thus the metallic catalyst may be deposited on a portion of the surface of the silicon layer. Referring to FIG. 4C, due to passivation with hydrogen and fluorine, the surface of the silicon layer may have strong hydrophobicity; and the metallic catalyst may be hardly formed on the surface of the silicon layer. As described above, the metallic catalyst may be deposited to a greater degree on the silicon layer of FIG. 4A having the strong hydrophilic surface than on the silicon layer of FIG. 4B having the weak hydrophilic surface and may be hardly formed on the silicon layer of FIG. 4C having the strong hydrophobic surface. That is, when the degree of hydrophilicity is increased, the metallic catalyst may be deposited to a greater degree. When the degree of hydrophobicity is increased, the metallic catalyst may be deposited to a lesser degree.

When the surface of an amorphous silicon layer is not treated to obtain hydrophobicity, and when a nickel layer having a density of $10^{13}$ atom/cm$^2$ is formed, the nickel layer may need to be formed at a low temperature for a short period of time. For example, nickel may be deposited for only about 4 to about 5 minutes at a substrate temperature of only about 130 to about 140° C. However, at such a low temperature, physical adsorption may occur and it may be difficult to form a reproducible density of the nickel layer.

In the method according to an embodiment, a metallic catalyst may be formed on an amorphous silicon layer at a density of about $10^{11}$ to about $10^{14}$ atom/cm$^2$ by controlling a degree of hydrophobicity of the amorphous silicon layer. It may not be difficult to form the metallic catalyst on the amorphous silicon layer at a high density and it may be very difficult to form the metallic catalyst on the amorphous silicon layer at a low density of $10^{14}$ atom/cm$^2$ or less. However, when the amorphous silicon layer is treated to obtain a hydrophobic surface, even when the metallic catalyst is formed under a condition in which normally a high density of the metallic catalyst is formed, i.e., at a high temperature and/or for a long period of time, the deposition degree of the metallic catalyst with respect to the surface of the amorphous silicon layer may be decreased. Thus, the metallic catalyst may be easily and reproducibly formed at a low density of $10^{14}$ atom/cm$^2$ or less.

EXAMPLE 1

An amorphous silicon layer was formed and then treated with an HF solution to obtain a hydrophobic surface. Then, nickel as a metallic catalyst was deposited on the amorphous silicon layer at a substrate temperature of 200° C. by ALD. The hydrophobicity treatment using the HF solution was performed as follows: first, an ultra pure water (UPW) treatment was performed, followed by a diluted hydrogen fluoride (DHF) solution treatment, which was then followed by another UPW treatment, which was then followed by yet another UPW treatment, and finally drying. In regard to the UPW treatment and the DHF treatment, a substrate on which the amorphous silicon layer was formed and the resultant structure was dipped in UPW and a DHF solution for given periods of time, respectively. Then, a heat treatment was performed thereon at a temperature of about 600 to about 800° C. so as to crystallize the amorphous silicon layer into a polycrystalline silicon layer.

COMPARATIVE EXAMPLE 1

An amorphous silicon layer was formed and washed only with UPW, and then nickel as a metallic catalyst was deposited on the amorphous silicon layer at a substrate temperature of 130° C. for 7 minutes by ALD. Then, a heat treatment was performed thereon at a temperature of 700° C. for 60 minutes so as to crystallize the amorphous silicon layer into a polycrystalline silicon layer.

COMPARATIVE EXAMPLE 2

An amorphous silicon layer was formed and washed only with UPW, and then nickel as a metallic catalyst was deposited on the amorphous silicon layer at a substrate temperature of 160° C. for 10 minutes by ALD. Then, a heat treatment was performed thereon at a temperature of 700° C. for 60 minutes so as to crystallize the amorphous silicon layer into a polycrystalline silicon layer.

EVALUATION

Figure 5A:
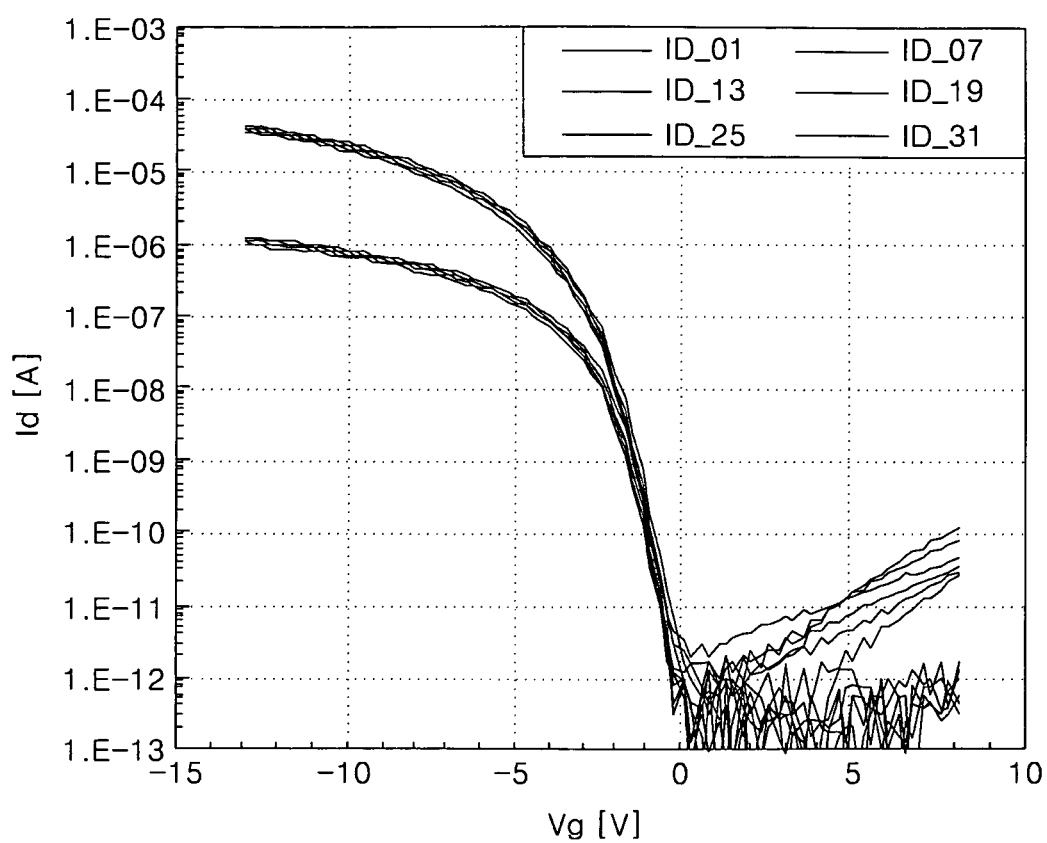
FIG. 5A illustrates a graph of Id versus Vg of a thin film transistor (TFT) including a polycrystalline silicon layer manufactured according to Example 1.
Figure 5B:
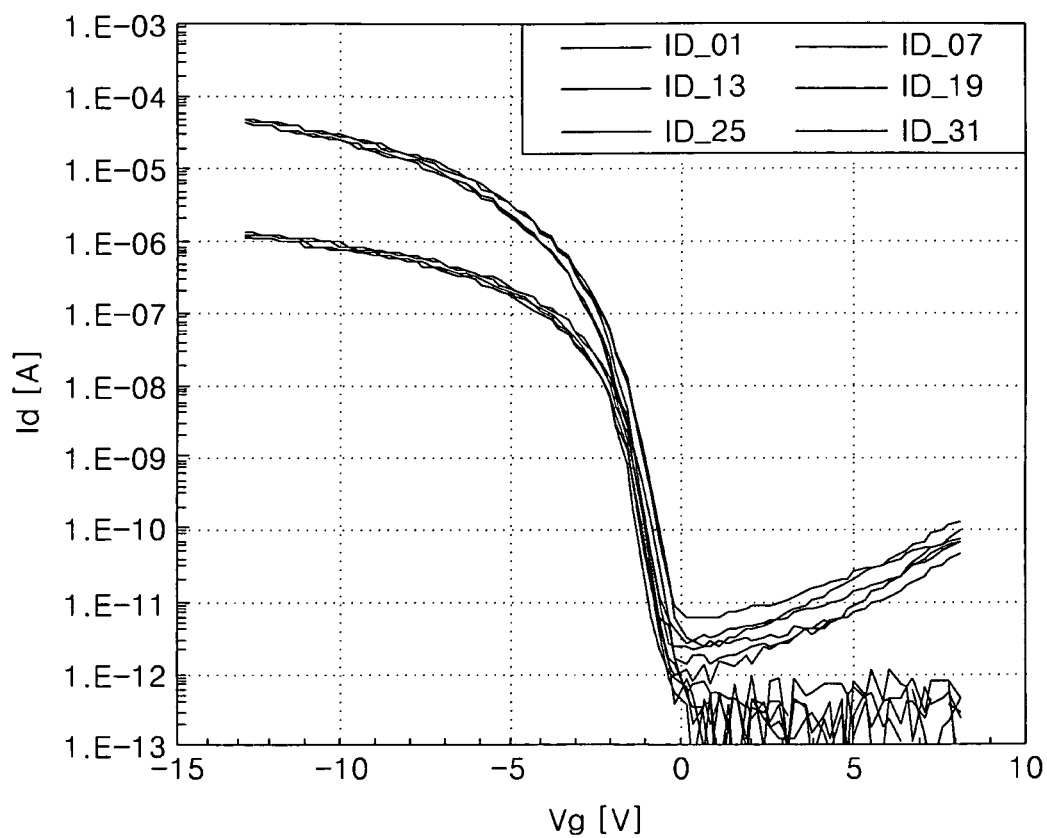
FIG. 5B illustrates a graph of Id versus Vg of a TFT including a polycrystalline silicon layer manufactured according to Comparative Example 1.

FIG. 5A illustrates a graph of Id versus Vg of a thin film transistor (TFT) including the polycrystalline silicon layer manufactured according to Example 1 as an activation layer. FIG. 5B illustrates a graph of Id versus Vg of a TFT including the polycrystalline silicon layer manufactured according to Comparative Example 1. FIGS. 5A and 5B illustrate results evaluated at a plurality of spots (represented by ID_number) on the same substrate when Vds was −5.1 V (group having high Ids) and when Vds was −0.1 V (group having low Ids).

When an Id minimum value range of the graph of FIG. 5A is compared to an Id minimum value range of the graph of FIG. 5B, curves of the graph of FIG. 5A have a Id minimum value (off-current value) of about $2\times10^{-12}$ [A] or less and curves of the graph of FIG. 5B have a Id minimum value of about $8\times10^{-12}$ [A] or less. In this regard, $2\times10^{-12}$ [A] of the graph of FIG. 5A and $8\times10^{-12}$ [A] of the graph of FIG. 5B are Id values measured at the same spot on the substrate. From the results, it may be seen that an off-current value of the polycrystalline silicon layer manufactured according to Example 1 was smaller than an off-current value of the polycrystalline silicon layer manufactured according to Comparative Example 1.

Figure 6:
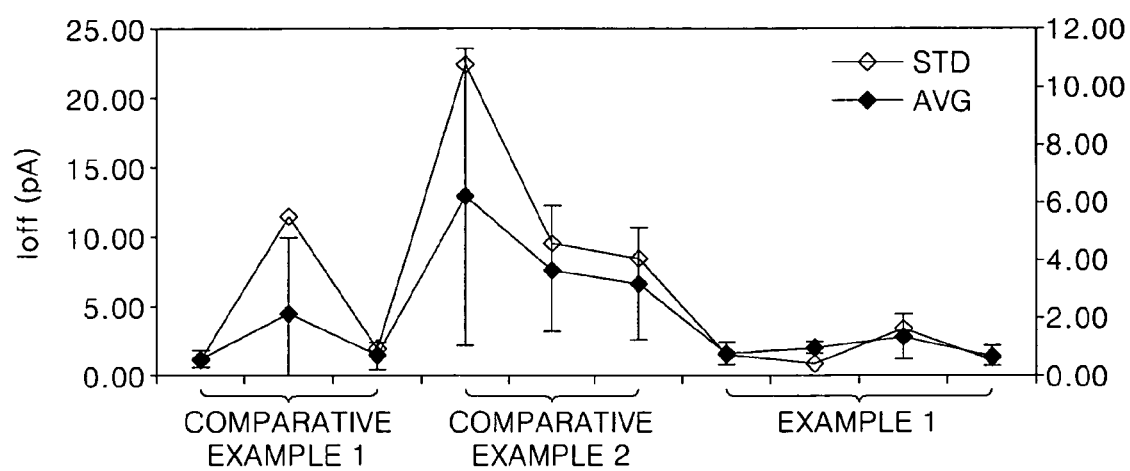
FIG. 6 illustrates a graph showing off-current characteristics of TFTs including polycrystalline silicon layers manufactured according to Example 1 and Comparative Examples 1 and 2.

Leakage current characteristics of a polycrystalline silicon layer manufactured according to an embodiment will now be described in detail. FIG. 6 illustrates a graph showing off-current characteristics of TFTs including the polycrystalline silicon layers manufactured according to Example 1 and Comparative Examples 1 and 2. In Comparative Example 1, without the hydrophobicity treatment, nickel was deposited on the amorphous silicon layer at a temperature of 130° C. for 7 minutes and then heat-treated to crystallize the amorphous silicon layer into the polycrystalline layer. In Comparative Example 2, without the hydrophobicity treatment, nickel was deposited on the amorphous silicon layer at a temperature of 160° C. for 10 minutes and then heat-treated to crystallize the amorphous silicon layer into the polycrystalline silicon layer. In Example 1, nickel was deposited at a temperature of 200° C. for 10 minutes on the amorphous silicon layer that had been subjected to the hydrophobicity treatment using the HF solution and then heat-treated to crystallize the amorphous silicon layer into the polycrystalline silicon layer. For Comparative Examples 1 and 2, samples at three different spots in the substrate were evaluated, and for Example 1, samples at four different spots in the substrate were evaluated. In FIG. 6, an off-current value is a minimum value of Ids in the graph of Ids versus Vg. A large off-current value means a high leakage current.

Referring to FIG. 6, among the off current values of Example 1 and Comparative Examples 1 and 2, the off current value of Example 1 was smallest, and the off current value of Comparative Example 1 was smaller than the off current value of Comparative Example 2. It may be assumed that the off current value of Example 1 was smallest due to the fact that the nickel metallic catalyst was formed on the amorphous silicon layer at a low density and thus the amount of nickel remaining on the polycrystalline silicon layer after crystallization was small.

It may also be assumed that the off-current value and scattering of Comparative Example 1 were greater than those of Example 1 due to the fact that although, in Comparative Example 1, nickel was deposited at a low density on the amorphous silicon layer at a low temperature (130° C.) for a short period of time, nickel was physically adsorbed at a low temperature and thus stability and reproducibility of the formed nickel layer were degraded.

It may also be assumed that the off-current value of Comparative Example 2 was greater than the off-current value of Comparative Example 1 and thus the leakage current of Comparative Example 2 was higher than the leakage current of Comparative Example 1 due to the fact that nickel was deposited at a higher temperature (160° C.) for a longer period of time in Comparative Example 2 than in Comparative Example 1, and thus a higher density of the nickel layer was formed on the amorphous silicon layer and the amount of the residual nickel was high.

In Example 1, nickel was deposited at higher temperature than in Comparative Example 2 and thus the nickel layer was stably and reproducibly formed. In addition, due to the hydrophobicity treatment, the amount of nickel deposited on the amorphous silicon layer was able to be micro-controlled. Thus, leakage current characteristics of the polycrystalline silicon layer were improved.

FIGS. 7A through 7D illustrate cross-sectional views of stages in a method of manufacturing a TFT including a polycrystalline silicon according to an embodiment as an activation layer.

Figure 7A:
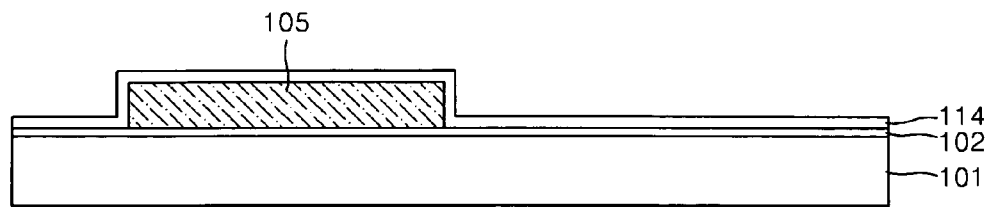
FIGS. 7A through 7D illustrate cross-sectional views of stages in a method of manufacturing a TFT according to an embodiment.

Referring to FIG. 7A, a buffer layer 102 may be formed on a substrate 101; and a polycrystalline silicon layer may be formed on the buffer layer 102. The polycrystalline silicon layer may be patterned to form an activation layer 105. The polycrystalline silicon layer may be formed according to one of the methods as described in the embodiments described with reference to FIGS. 1 and 2. For example, an amorphous silicon layer may be formed and then treated to obtain a hydrophobic surface and then a metallic catalyst may be formed thereon and a heat treatment may be performed on the resultant structure to crystallize the amorphous silicon layer.

Figure 7B:
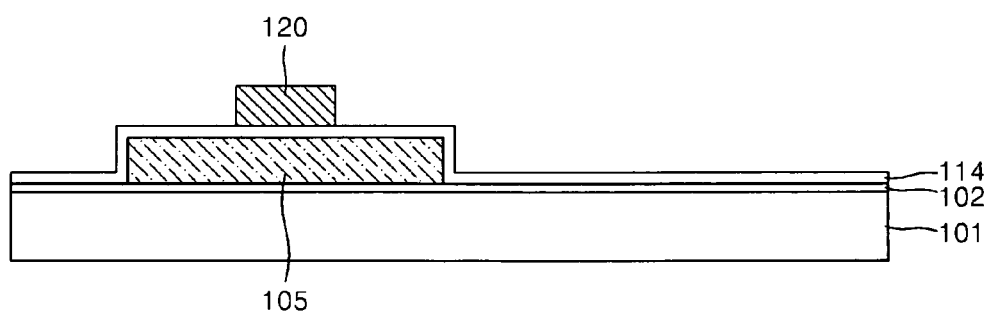

Referring to FIG. 7B, a gate insulating layer 114 may be formed on the activation layer 105; and a conduction layer may be formed on the gate insulating layer 114 and then patterned to form a gate electrode 120. The gate insulating layer 114 may be, e.g., an insulating layer such as a silicon oxide layer or a silicon nitride layer. The gate electrode 120 may be formed of, e.g. Au, Ag, Cu, Ni, Pt, Pd, Al, Mo, W, Ti, or an alloy thereof.

Figure 7C:
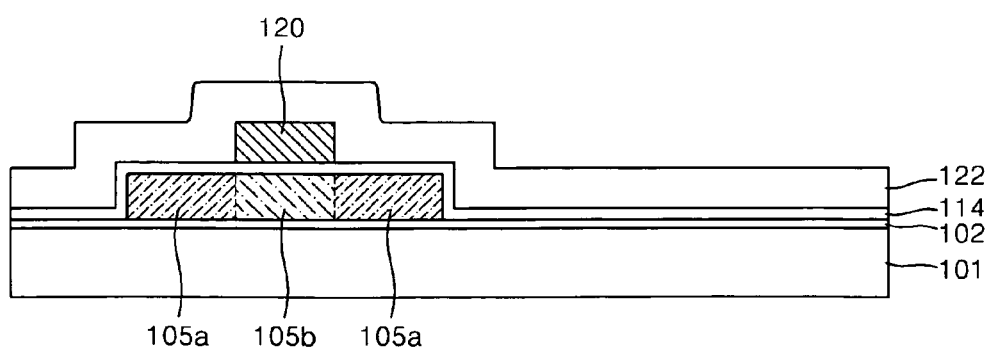

Referring to FIG. 7C, source/drain regions 105a may be formed in opposite ends of the activation layer 105; and a first interlayer insulating layer 122 may be formed on the resultant structure. A channel region 105b may be formed in a portion of the activation layer 105 between the source/drain regions 105a. The source/drain regions 105a may be formed by using a self-alignment method including ion-doping using the gate electrode 120 as a mask. The first interlayer insulating layer 122 may be, e.g., a single insulating layer such as a silicon oxide layer or a silicon nitride layer, or a plurality of the insulating layers.

Figure 7D:
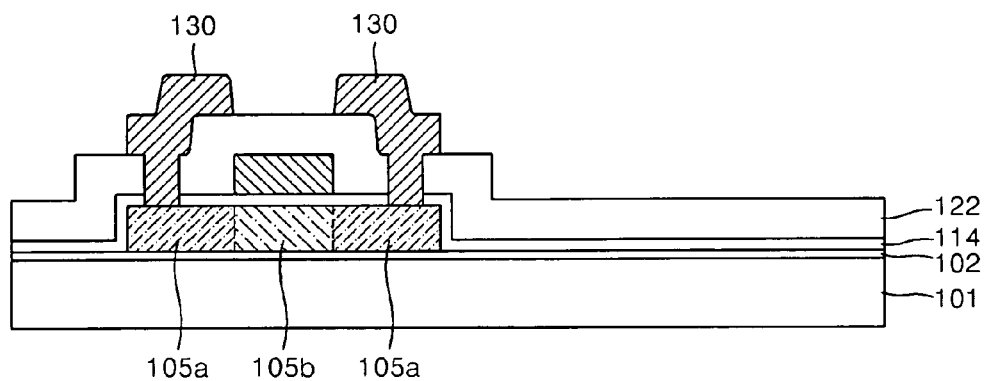

Referring to FIG. 7D, source/drain electrodes 130 contacting the source/drain regions 105a may be formed in the first interlayer insulating layer 122. The source/drain electrodes 130 may be formed by forming holes exposing an upper surface of the source/drain regions 105a in the first interlayer insulating layer 122, followed by filling the holes with a conduction layer and patterning the conduction layer. The conduction layer may include, e.g., Au, Ag, Cu, Ni, Pt, Pd, Al, Mo, W, Ti, or an alloy thereof.

In regard to a TFT formed as described above, leakage current characteristics may be improved since an amount of the metallic catalyst remaining in the polycrystalline silicon layer, which constitutes the activation layer 105, may be very small.

Figure 8:
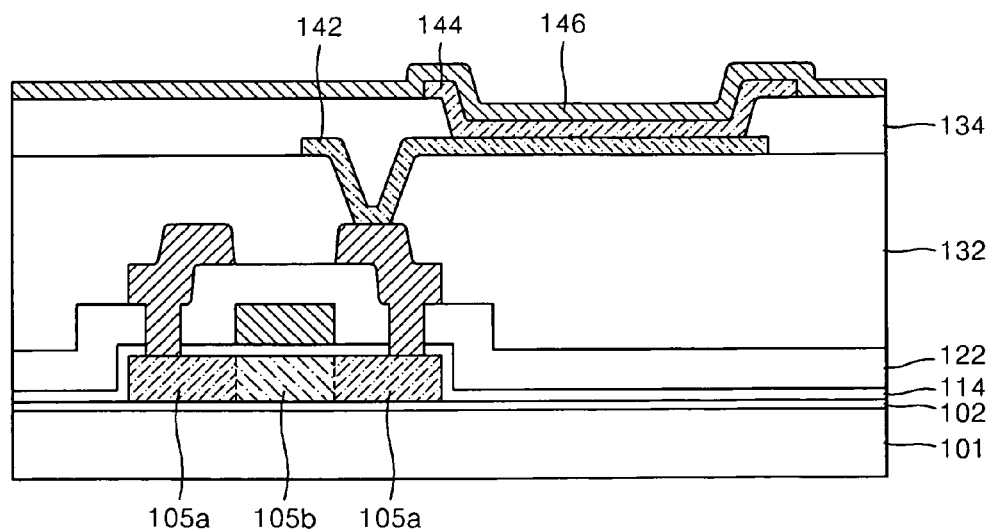
FIG. 8 illustrates a cross-sectional view of an organic light emitting display device according to an embodiment.

FIG. 8 illustrates a cross-sectional view of an organic light emitting display device according to an embodiment.

Referring to FIG. 8, the organic light emitting display device according to the present embodiment may include a TFT manufactured using the method described in connection with FIGS. 7A through 7D. A second interlayer insulating layer 132 may be formed on the TFT. The second interlayer insulating layer 132 may include an organic layer or an inorganic layer.

In a pixel unit, a first electrode 142 may pass through the second interlayer insulating layer 132 and may contact any one of the source/drain electrodes 130. The first electrode 142 may extend onto the second interlayer insulating layer 132. The first electrode 142 may be a transparent conductive oxide layer formed of, e.g., indium tin oxide (ITO) or indium zinc oxide (IZO).

An organic layer 144 may contact a portion of the first electrode 142 exposed by a pixel definition layer 134 on the second interlayer insulating layer 132. The pixel definition layer 134 may include an organic layer or an inorganic layer. The organic layer 144 may include an emission layer, and may further include any one of, e.g., a hole injection layer, a hole transport layer, an electron transport layer, and an electron injection layer. A second electrode 146 may be formed on the organic layer 144. The second electrode 146 may be formed of metal, e.g., Mg, Ag, Al, Ca, or an alloy thereof.

As described above, according to the one or more of the above embodiments, a hydrophilic surface of an amorphous silicon layer may be changed into a hydrophobic surface, thereby facilitating deposition of a very small amount of a metallic catalyst on the amorphous silicon layer. Thus, leakage current characteristics of a device including the amorphous silicon layer having the hydrophobic surface may be improved.

In a silicon crystallization technique using a metallic catalyst, micro-control of the metallic catalyst may be a core technique and it may be very important that a very small amount of the metallic catalyst is formed stably and reproducibly. If a relatively large amount of the metallic catalyst is used, the metallic catalyst may be stably formed, but leakage current characteristics may be degraded and a size of crystal grains of generated polycrystalline silicon may be small. When the metallic catalyst is formed to have a density of about $10^{14}$ atom/cm$^2$ or less, it may be difficult to monitor the amount of the formed metallic catalyst. Also, an amount of the metallic catalyst may be highly affected by factors, e.g., characteristics of formed amorphous silicon layer, a washing process, or the state of deposition equipment for the metallic catalyst. Thus, it may be very difficult to obtain reproducibility. According to the embodiments, micro-control of the metallic catalyst may facilitate stable reproducibility by controlling hydrophobicity of a surface of an amorphous silicon layer.

The methods of an embodiment may be excellent for stably forming a metallic catalyst in small amounts of, e.g., $10^{14}$ atom/cm$^2$ or less. Thus, reproducibility for large-scale production may be achieved. An amount of the metallic catalyst may be controlled without forming a coverage layer on an amorphous silicon layer and then forming the metallic catalyst on the coverage layer. Thus, drawbacks of using the coverage layer, e.g., an additional process in order to remove the used coverage layer and damage to the surface of the polysilicon layer and resultant degradation of the device, may be avoided.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of crystallizing a silicon layer, the method comprising:
    forming an amorphous silicon layer on a substrate;
    performing a hydrophobicity treatment on a surface of the amorphous silicon layer so as to obtain a hydrophobic surface thereon;
    forming a metallic catalyst on the hydrophobic surface of the amorphous silicon layer that has been subjected to the hydrophobicity treatment; and
    heat-treating the amorphous silicon layer including the metallic catalyst thereon to crystallize the amorphous silicon layer into a polycrystalline silicon layer.

2. The method as claimed in claim 1, wherein performing the hydrophobicity treatment includes using a solution of a hydrogen or fluorine-containing material.

3. The method as claimed in claim 2, wherein the solution of the hydrogen or fluorine-containing material includes HF.

4. The method as claimed in claim 2, wherein performing the hydrophobicity treatment further includes controlling a degree of hydrophobicity after treating with the solution of the hydrogen or fluorine-containing material.

5. The method as claimed in claim 4, wherein controlling the degree of hydrophobicity includes treating the amorphous silicon layer with deionized water.

6. The method as claimed in claim 5, wherein performing the hydrophobicity treatment includes performing an ultra pure water treatment, performing a diluted hydrogen fluoride (DHF) solution treatment, performing an ultra pure water treatment, performing an ultra pure water treatment, and drying, which are performed in the stated order.

7. The method as claimed in claim 1, wherein performing the hydrophobicity treatment includes treating the amorphous silicon layer with hydrogen plasma or fluorine plasma.

8. The method as claimed in claim 7, wherein the fluorine plasma includes $CF_4$ gas, $CHF_3$ gas, $C_2F_6$ gas, $C_3F_8$ gas, $F_2$ gas, or $NF_3$ gas.

9. The method as claimed in claim 8, wherein performing the hydrophobicity treatment further includes controlling a degree of hydrophobicity after treating with hydrogen plasma or fluorine plasma.

10. The method as claimed in claim 1, wherein forming the metallic catalyst includes forming a metallic catalyst by physical vapor deposition (PVD), atomic layer deposition (ALD), or ion implantation.

11. The method as claimed in claim 10, wherein the metallic catalyst is formed by ALD and a process temperature of the ALD is about 160 to about 240° C.

12. The method as claimed in claim 1, wherein forming the metallic catalyst includes forming the metallic catalyst having a density of about $10^{11}$ to $10^{14}$ atom/cm$^2$.

13. A method of manufacturing a thin film transistor (TFT), the method comprising:
    forming a polycrystalline silicon layer on a substrate by using the method of claim 1;
    forming a gate insulating layer on the polycrystalline silicon layer;
    forming a gate electrode on the gate insulating layer;
    forming source/drain regions in opposite ends of the gate electrode;
    forming an interlayer insulating layer on the gate electrode and the gate insulating layer; and
    forming a source/drain electrode such that the source/drain electrode passes through the interlayer insulating layer and contacts any one of the source/drain regions.

14. The method as claimed in claim 13, performing the hydrophobicity treatment includes using a solution of a hydrogen or fluorine-containing material.

15. The method as claimed in claim 13, wherein performing the hydrophobicity treatment includes treating the amorphous silicon layer with hydrogen plasma or fluorine plasma.

16. The method as claimed in claim 1, wherein performing the hydrophobicity treatment on the surface of the amorphous silicon layer so as to obtain the hydrophobic surface thereon includes removing a thermal oxide layer or a natural oxide layer from the surface of the amorphous silicon layer.

17. The method as claimed in claim 1, wherein performing the hydrophobicity treatment on the surface of the amorphous silicon layer so as to obtain the hydrophobic surface thereon includes passivating the surface of the amorphous silicon layer with a —H group or a —F group.

* * * * *